United States Patent [19]

Williams

[11] Patent Number: 4,620,119
[45] Date of Patent: Oct. 28, 1986

[54] DUAL-MODE TIMER CIRCUIT

[75] Inventor: Gregory A. Williams, Elk Grove Village, Ill.

[73] Assignee: Zenith Electronics Corporation, Glenview, Ill.

[21] Appl. No.: 638,090

[22] Filed: Aug. 6, 1984

[51] Int. Cl.$^4$ .................. H03K 17/28; H03K 5/159
[52] U.S. Cl. .................. 307/595; 307/602; 328/78
[58] Field of Search .................. 307/590–596, 307/597, 602, 603; 328/78

[56] References Cited

U.S. PATENT DOCUMENTS

| | | | |
|---|---|---|---|
| 3,060,329 | 10/1962 | Harrison et al. | 328/78 |
| 3,673,434 | 6/1972 | McIntosh | 307/595 |
| 3,976,893 | 8/1976 | Banfi | 307/595 |
| 4,047,058 | 9/1977 | Green | 307/595 |

Primary Examiner—Stanley D. Miller
Assistant Examiner—B. P. Davis

[57] ABSTRACT

A dual mode timer circuit has first and second two-input NOR gates with inputs connected to receive a trigger pulse and outputs respectively coupled to first and second RC charging networks. An output NOR gate has its two inputs connected to the RC charging networks respectively, and its output connected to an output terminal. A control input voltage signal is coupled to a fourth NOR gate whose output is connected to control activation of the second RC charging network which has a shorter time constant than the first RC network. The output signal duration is dependent upon which RC network is effective. The output terminal is connected to the other inputs of the first and second NOR gates to render the circuit independent of trigger pulse duration.

4 Claims, 2 Drawing Figures

DUAL-MODE TIMER CIRCUIT

BACKGROUND OF THE INVENTION

This invention relates in general to timer circuits and in particular to a two mode timer circuit that is capable of selectively generating two different duration output signals in response to a trigger pulse.

Timer circuits are well known in the art, especially in the digital field. They generally comprise monostable gates that are obtainable in an integrated circuit or "chip" form and which are used with external resistance-capacitance (RC) networks for timing control. Such timers are fairly precise in operation and may be readily procured at relatively low cost. Yet, there are many circuit applications where somewhat less precise timers would suffice. In some applications a timer having two selective time bases is required. In such applications the circuit of the invention will function at nearly the same degree of precision as a pair of monostable gates, but at about one-fifth the cost. The inventive dual mode timer uses a readily available low cost CMOS type 4001 chip that has four OR gates. Thus, the invention solves a need in the art for a low cost, simple dual mode timer of moderate precision.

OBJECTS OF THE INVENTION

A principal object of the invention is to provide a simple low cost dual mode timer circuit.

A further object of the invention is to provide a novel dual mode timer.

SUMMARY OF THE INVENTION

In accordance with the invention, a timer is operable to selectively generate two output signals of different duration at an output terminal in response to a trigger signal at an input terminal. It includes output means coupled to the output terminal for generating an output signal and first and second timing circuits coupled between the input terminal and the output means for determining the duration of the output signal generated. Control means selectively render the first and second timing circuits effective, thus changing the duration of the output signal.

BRIEF DESCRIPTION OF THE DRAWING

These and other objects of the invention will be apparent upon reading the following description in conjunction with the drawing in which.

DESCRIPTION OF THE PREFERRED EMBODIMENT

Figure 1:
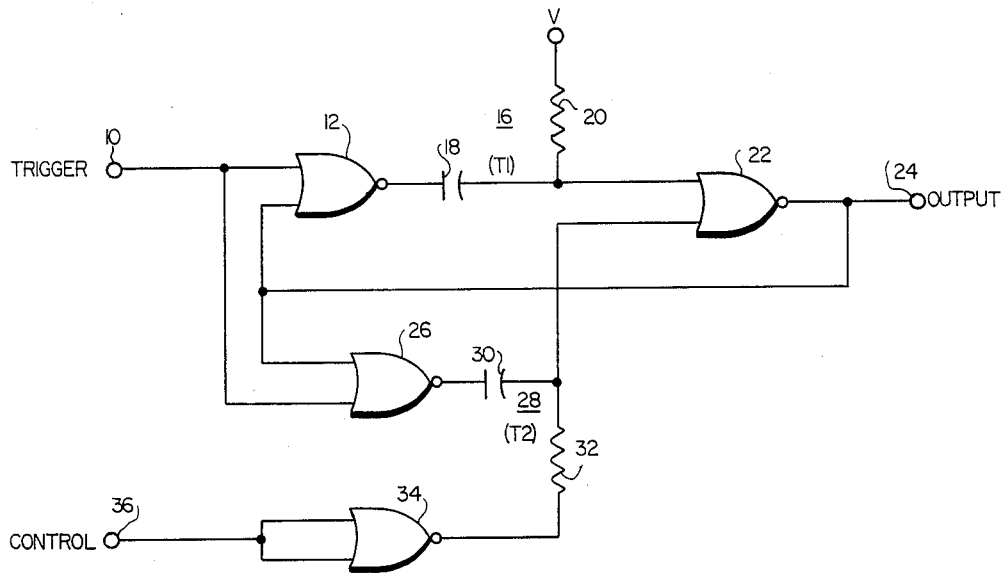
FIG. 1 is a schematic diagram of the dual mode timer of the invention.

Referring to FIG. 1, a trigger input terminal 10 is connected to one input of a first NOR gate 12 and to one input of a second NOR gate 26. The output of NOR 12 is connected to a capacitor 18, the other terminal of which is connected to the input of a third NOR gate 22 and, through a resistor 20, to a positive voltage source V. The combination of capacitor 18 and resistor 20 forms a first RC timing circuit 16. The output of second NOR 26 is similarly connected to a capacitor 30 which, in turn, is connected to the other input of the third NOR 22 and to a resistor 32. Capacitor 30 and resistor 32 form a second RC timing circuit 28. The output of third NOR 22 is supplied to an output terminal 24 and to the second inputs of NORs 12 and 26. Finally, a control input terminal 36 is connected to both inputs of a fourth NOR gate 34, the output of which is connected to the other end of resistor 32 in the second timing circuit 28.

Figure 2:
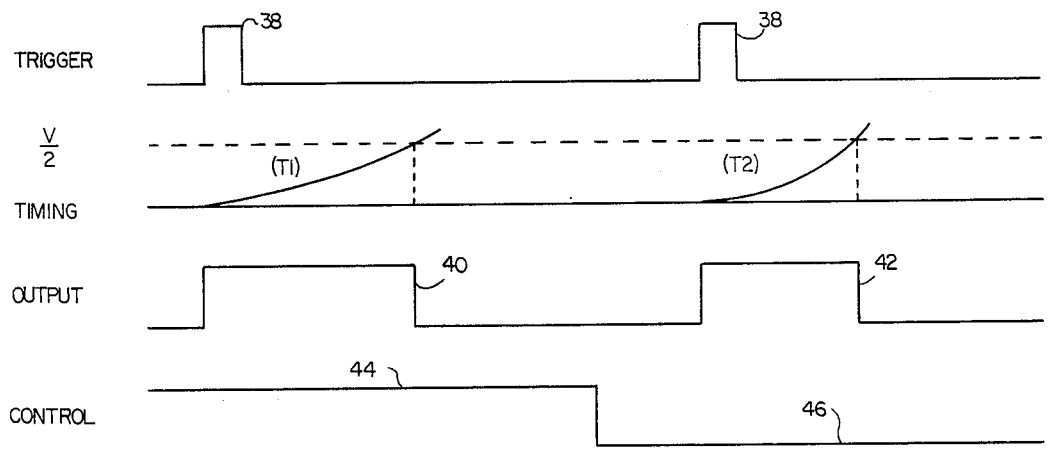
FIG. 2 is a series of waveforms showing the input and output voltages of the timer of FIG. 1.

The terminals 10, 24 and 36 are labelled "Trigger", "Output" and "Control", respectively, which nomenclature is used in connection with the waveforms of FIG. 2. The circuit functions as follows: A positive (high) trigger pulse applied to input terminal 10 forces a low at the output of NOR 12. Capacitor 18, which is discharged at this time, "passes" the low to NOR 22. The low at the input of NOR 22 results in a high at output terminal 24 and the leading edge of output signal 40 is produced. This high is fed back to the input of NOR 12 and keeps its output low despite the termination of the trigger pulse. The low at the output of NOR 12 permits capacitor 18 to charge. Timing circuit 16 begins to "time out" as capacitor 18 is charged through resistor 20 from the positive voltage source. The trigger pulse is indicated by waveform 38 labelled TRIGGER and the charge voltage, labelled TIMING, for the first RC timing circuit 16 is illustrated by T1.

The trigger pulse is also applied to NOR 26 and similarly forces its output low. The control input voltage is illustrated by the waveform labelled CONTROL and may be either high or low. Assuming that the control input at terminal 36 is high, both inputs to NOR 34 are high which results in a low at its output. Consequently, capacitor 30 in timing circuit 28 does not charge and the voltage thereacross remains low. Hence the input of NOR 22 connected to timing circuit 28 is low. Observation of the TIMING waveform shows that when charge voltage T1 reaches a threshold near V/2 it corresponds to a high at the associated input for NOR 22, resulting in a low at output terminal 24. Consequently as shown by the waveform labelled OUTPUT, output signal 40 is terminated. Its duration is thus seen to be a function of first RC timing network 16.

A change in control input results in an output signal 42 of shorter duration being developed at output terminal 24. With a low control input, both inputs to NOR 34 are low and its output goes high. When a trigger pulse is received, timing circuit 28 is now activated because of this high at the output of NOR 34. It will be noted that timing circuit 16 is also activated, as described previously. The output of NOR 22 again goes high and output signal 42 is generated. Timing circuit 28 is selected to have a shorter time constant than timing circuit 16 and, consequently, it reaches the V/2 threshold potential before timing circuit 16 and terminates output signal 42. Therefore, timing circuit 28 determines the duration of the output signal 42 at output terminal 24.

Thus waveform 40 is developed when the control voltage is high, as indicated at 44, and waveform 42 is developed when the control voltage is low, as indicated at 46. While timing circuit 16 charges under both types of control voltages, it doesn't charge fast enough to trigger NOR gate 22 when timing circuit 28 is activated. Therefore, by changing the control voltage, the timer circuit will selectively produce two different duration output signals. Repetitive trigger pulses will naturally generate repetitive output signals.

As mentioned above, the connection between the output of NOR 22 and the inputs of NORs 12 and 26 provides a feedback circuit for holding NORs 12 and 26 activated in the presence of a short duration trigger pulse. As was seen the trigger pulse drives the output of NOR 22 high and this high, when communicated back to the inputs for NORs 12 and 26, results in their output terminals being held in a low state even though the trigger pulse terminates.

What has been described is a novel, low cost, dual mode timer circuit which utilizes an off-the-shelf single chip package of four NOR gates. It is recognized that numerous modifications in the described embodiment of the invention will be apparent to those skilled in the art without departing from the true spirit and scope thereof. The invention is to be limited only as defined in the claims.

What is claimed is:

1. A timer having an input terminal and an output terminal and operable for selectively generating an output signal of two different durations at said output terminal in response to a trigger pulse at said input terminal comprising:

output means comprising a two-input logic gate coupled to the output terminal for generating an output signal;

a first RC network timing circuit coupled between said input terminal and one of the inputs of said logic gate;

a second RC network timing circuit, having a timing duration different from said first timing circuit, coupled between said input terminal and the other input of said logic gate;

control means for selectively rendering said first and said second timing circuits effective to change the duration of the output signal generated by said output means, said control means controlling activation of the one of said RC networks having the shorter time constant, said RC networks being charged in parallel and the one having the shorter time constant controlling said output means; and further including second and third two-input logic gates, each having one input supplied with said trigger pulse, another input connected to said output terminal and outputs respectively connected to said first and said second RC network timing circuits.

2. The timer of claim 1 wherein said control means comprises a fourth two-input logic gate having both its inputs tied together and its output connected to said second timing circuit, all of said logic gates being on a common chip.

3. The timer of claim 2 wherein all of said logic gates are NORs.

4. A timer having an input terminal and an output terminal and operable for selectively generating an output signal of different duration at said output terminal in response to a trigger pulse at said input terminal comprising:

a first RC charging network and a second RC charging network, said second RC charging network having a time constant shorter than said first RC charging network;

a first logic gate coupled between said input terminal and said first RC charging network;

a second logic gate coupled between said input terminal and said second RC charging network;

an output logic gate having a pair of inputs coupled to said charging networks, respectively, and an output coupled to said output terminal, all of said logic gates being NOR gates and all being on a common chip; and control means including a control logic gate, connected to said second RC charging network, said second RC charging network thereby controlling operation of said output logic gate.

* * * * *